(12) United States Patent
Baum et al.

(10) Patent No.: US 7,719,256 B1
(45) Date of Patent: May 18, 2010

(54) METHOD FOR DETERMINING A SEPARATION TIME

(75) Inventors: Jerry D. Baum, Los Angeles, CA (US); Anthony J. Bissonette, Torrance, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 303 days.

(21) Appl. No.: 12/076,564

(22) Filed: Mar. 20, 2008

(51) Int. Cl.
  *G01R 13/34* (2006.01)
(52) U.S. Cl. .................. 324/76.38; 327/17; 327/26; 324/76.15; 377/20
(58) Field of Classification Search ............... 324/76.38
  See application file for complete search history.

(56) References Cited

U.S. PATENT DOCUMENTS

| | | | | |
|---|---|---|---|---|
| 4,558,422 A * | 12/1985 | DenBeste et al. | ............. | 702/57 |
| 4,763,341 A * | 8/1988 | Murphy | ........................ | 377/20 |
| 5,025,461 A * | 6/1991 | Pauer | ........................ | 375/373 |
| 5,521,512 A * | 5/1996 | Hulina | ........................ | 324/533 |
| 5,541,958 A | 7/1996 | Ishizu | ........................ | 375/326 |
| 5,684,982 A | 11/1997 | Gates | ........................ | 395/551 |
| 5,828,983 A * | 10/1998 | Lombardi | ........................ | 702/66 |
| 6,021,110 A | 2/2000 | McGibney | ........................ | 370/208 |
| 6,313,881 B1 | 11/2001 | Reinhart et al. | ............. | 348/572 |
| 6,333,958 B1 * | 12/2001 | Stewart et al. | ............. | 377/10 |
| 6,636,080 B2 * | 10/2003 | Soda | ........................ | 327/24 |
| 7,285,946 B2 * | 10/2007 | Ems et al. | ............. | 324/76.38 |
| 2007/0222430 A1* | 9/2007 | Sullivan et al. | .......... | 324/76.15 |
| 2008/0106249 A1* | 5/2008 | Barrett et al. | ............ | 324/76.38 |

* cited by examiner

*Primary Examiner*—Timothy J Dole
*Assistant Examiner*—Benjamin M Baldridge
(74) *Attorney, Agent, or Firm*—John Tarlano

(57) ABSTRACT

A method for determining a time interval between leading edges of two adjacent cyclic input pulses of a series of cyclic input pulses. A sample of the cyclic input pulses is taken at each of a series of sampling times to produce sampling hits, each sampling hit being an indication of a presence of a cyclic input pulse, recording a count number at each of the sampling hits, determining initial sampling hits from the detected sampling hits, determining a minimum sampling interval between initial sampling hits, and determining a count number located at a back end of the minimum sampling interval, count numbers of the minimum sampling interval being used to determine a time interval between lead edges of two adjacent cyclic input pulses.

2 Claims, 6 Drawing Sheets

METHOD FOR DETERMINING A SEPARATION TIME

The present invention is a method for determining a separation time between a leading edge of each input pulse of an input signal and an start signal of the input pulse's time frame. Each time frame holds one input pulse.

In the method, a presence or an absence of each of a series of input pulses is sampled at each of a series of sampling times. Each sampling time has a count number. The count numbers are in successive order. A sampling time's count number, at which there is an occurrence of a leading edge of one of the input pulses, is identified. After the particular sampling time's count number is identified, a count value difference, between identified count number and a known count value for a start signal of the time frames that hold the input pulse, is found. A separation time between a leading edge of each input pulse of an input signal and an start signal of the input pulse's time frame is then calculated from the count value difference.

The separation time is determined by first finding a count number, S, of an arrival time on a time-line, for a leading edge of an input pulse. A count value, CV, for the known arrival time of the start signal is next determined. A count value difference, CVD, between the count number and the count value is then determined. A separation time, DeltaT, between the arrival time of the leading edge of the input pulse and the arrival time of the start signal of the time frame that holds the input pulse, is finally determined.

The sampling times are begun at a start signal of a time frame. The sampling times begin prior to arrival of a cyclic input pulse that is within the time frame. The sampling times form a series of sampling times. The sampling times are separated from each other by a single fixed time interval. The sampling times are given count numbers, that is, increasing counts.

The series of sampling times is given a series of count numbers. These count numbers have integer values. By using the count numbers, in association with an algorithm, a separation time, between a leading edge of a cyclic input pulse and the start signal of time frame that hold the cyclic input pulse, is determined. The separation time is determined relative to a period and frequency of the sampling times. Since the sampling times have a known period and frequency, in terms of absolute time, a separation time can be found.

The disclosed sampling technique involves taking a sample, at each of a succession of regular sample times, as cyclic input pulses arrive, in order to find a leading edge of one or more of the input pulses. Count numbers are used to number the succession of regular sampling times. A sample of the is taken at each of the succession of regular sampling times, to determine whether or not an input pulse is present. Energy of an input pulse, that is present, is made to pass through an electronic gate at the sampling time. The presence of an input pulse, at a sampling time, is recorded as a true or 1 bit. A 1 bit signifies a sampling hit. A sampling hit that initially occurs upon an arrival of an input pulse is referred to as an initial sampling hit. A sampling interval is the number of counts between two initial sampling hits. A minimum sampling interval is a minimum number of counts between two initial sampling hits. The absence of an input pulse, at a sampling point, is recorded as a false or 0 bit.

The present method detects a presence or an absence of an input pulse at each of a series of regular sampling times, in order to find a leading edge of an input pulse. The sampling times have a sampling frequency. The sampling frequency is preferably a significantly higher than the frequency of the input pulses.

The separation time is determined using a start signal of a time frame to start a sequence of samplings, at the sampling times, for input pulses. The location of an input pulse within its time frame is then determined by the present method.

The time frames have a same frequency as the frequency of the input pulses. A start signal of a time frame is used to start at a sampling time corresponding an integer count number of zero. This time frame is referred to as a first time frame. This first time frame holds input pulse I at a precise location on a time-line relative to the start signal of the first time frame. An immediately succeeding time, referred to as a second time frame, holds input pulse II. The second time frame holds input pulse II at the same precise location, relative to the start signal of the second time frame, that the first time frame holds input pulse I. A third time frame holds input pulse III. The third time frame holds input pulse III at the same precise location, relative to the start signal of the third time frame, that the first time frame holds input pulse I.

An algorithm is used to find a decimal count value difference, CVD, between the count value, CV, of a start signal of a time frame and a count number, S, at a time-line location for the leading edge of an input pulse within the time frame.

The count number that occurs at the back end of a minimum sampling interval between initial sampling hits, is determined. This count number, S, is used to find a leading edge of an input pulse. In an example of FIG. 1A, this count number is determined to have a count number of 24. The count value, CV, at the occurrence of the start signal of the time frame that includes the count value of 24, is known to be 19.2.

The algorithm, CVD=(S−CV), finds a count value difference, CVD, between the count number at the end of the minimum sampling interval and the count value at the beginning of the time frame that holds the count number.

In FIG. 1A, the algorithm finds that a count value difference, CVD, between the count number, S, of 24, at the back end of a first minimum sampling interval and the count value, CV, at the beginning of that particular time frame, of 19.2, is 4.2. Again, the count value difference is 4.2. This count value difference of 4.2 is proportional to the time between the start signal of a time frame and the location of an input pulse that is within that time frame. The count value difference, in this case, is 4.2. The 4.2 count value difference is multiplied by the time, ST, between two adjacent samplings for input pulses, in this example, being 0.1 seconds. 0.1 seconds is the time between adjacent sampling times. The time difference between a leading edge of an input pulse and a start signal of its time frame is 0.42 seconds.

SUMMARY OF THE INVENTION

A method for detecting an occurrence of a leading edge of a cyclic input pulse of a series of cyclic input pulses, comprising taking a sample of cyclic input pulses at each of a series of sampling times, the sampling times being separated from each other by a single fixed time interval, each sampling time of the series of sampling times having a count number, the count numbers being in successive order, detecting sampling hits, each sampling hit being an indication of a presence of a cyclic input pulse, recording the count number at each of the sampling hits, determining initial sampling hits from the detected sampling hits, determining a minimum sampling interval between initial sampling hits, and determining a count number located at a back end of the minimum sampling interval, the count number located at the back end of the minimum sampling interval being an indication of the occurrence of a lead edge of a cyclic input pulse.

DESCRIPTION OF THE PREFERRED EMBODIMENT

FIGS. 1A to 1F show a series of regular sampling times on a time-line T. The sampling times are separated from each other by a single fixed time. Each sampling times has a corresponding count number. The count numbers are in successive order. The count numbers are shown as 0 to 153. The corresponding count numbers for the sampling times are shown on time-line T. The lapse time, LT, between adjacent sampling times, is 0.1 seconds.

Figure 1A:
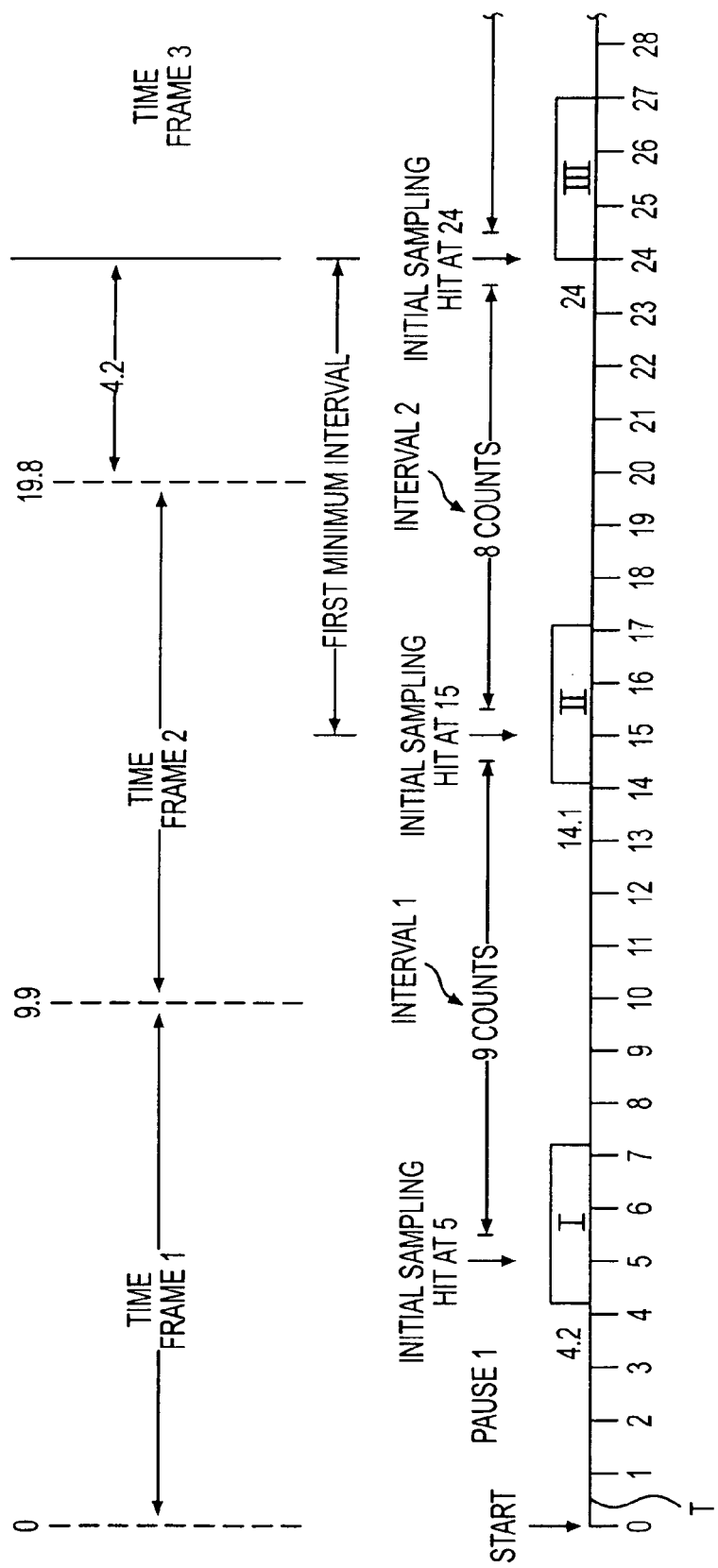
FIGS. 1A, 1B, 1C, 1D, 1E and 1F, taken together, form a sampling time diagram, the sampling time diagram showing sampling times for probing a series of cyclic input pulses.
Figure 1B:
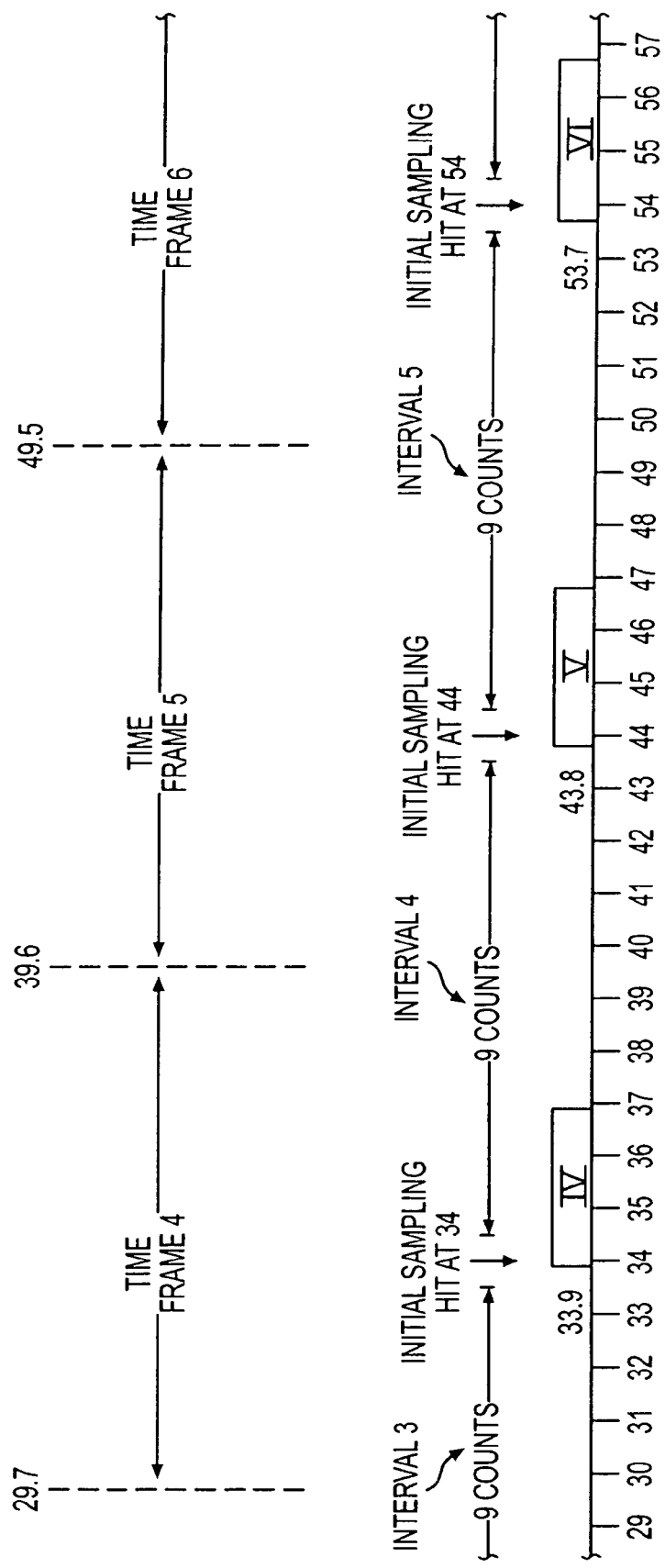
Figure 1C:
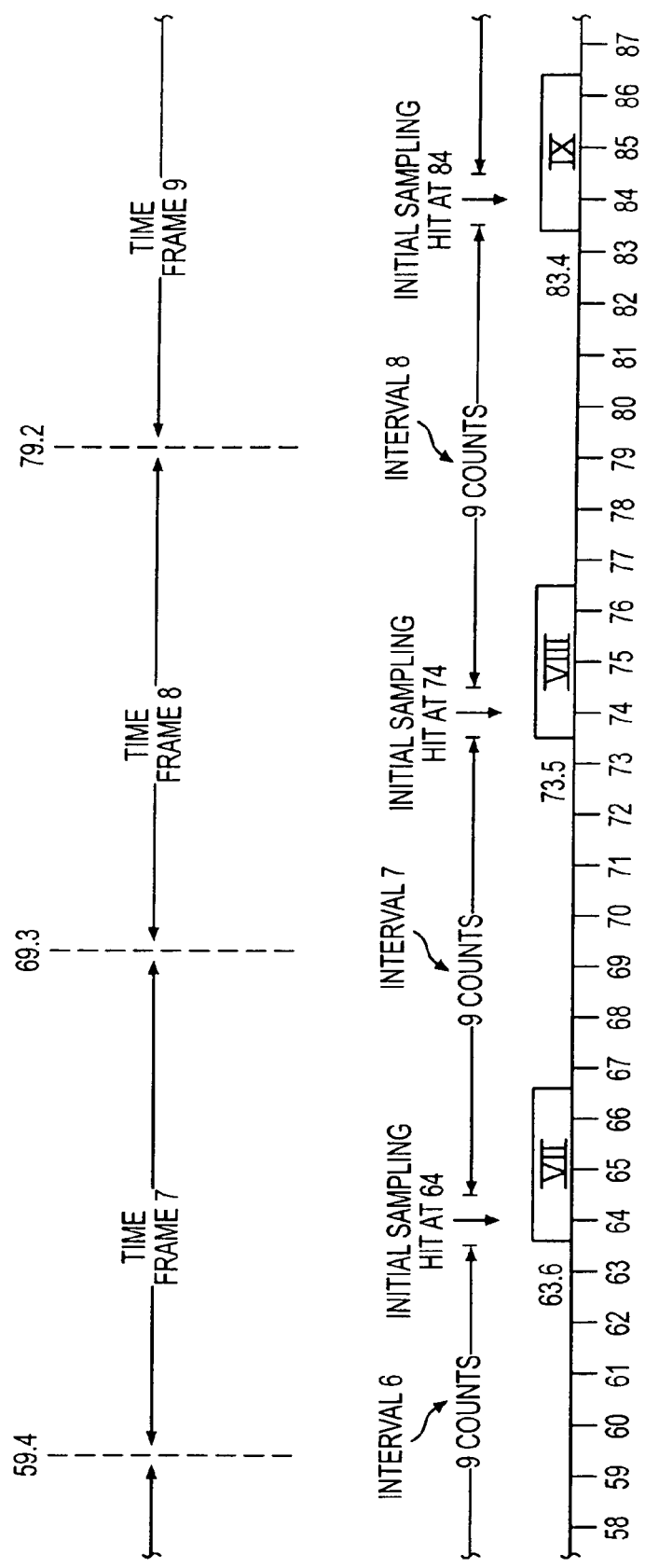
Figure 1D:
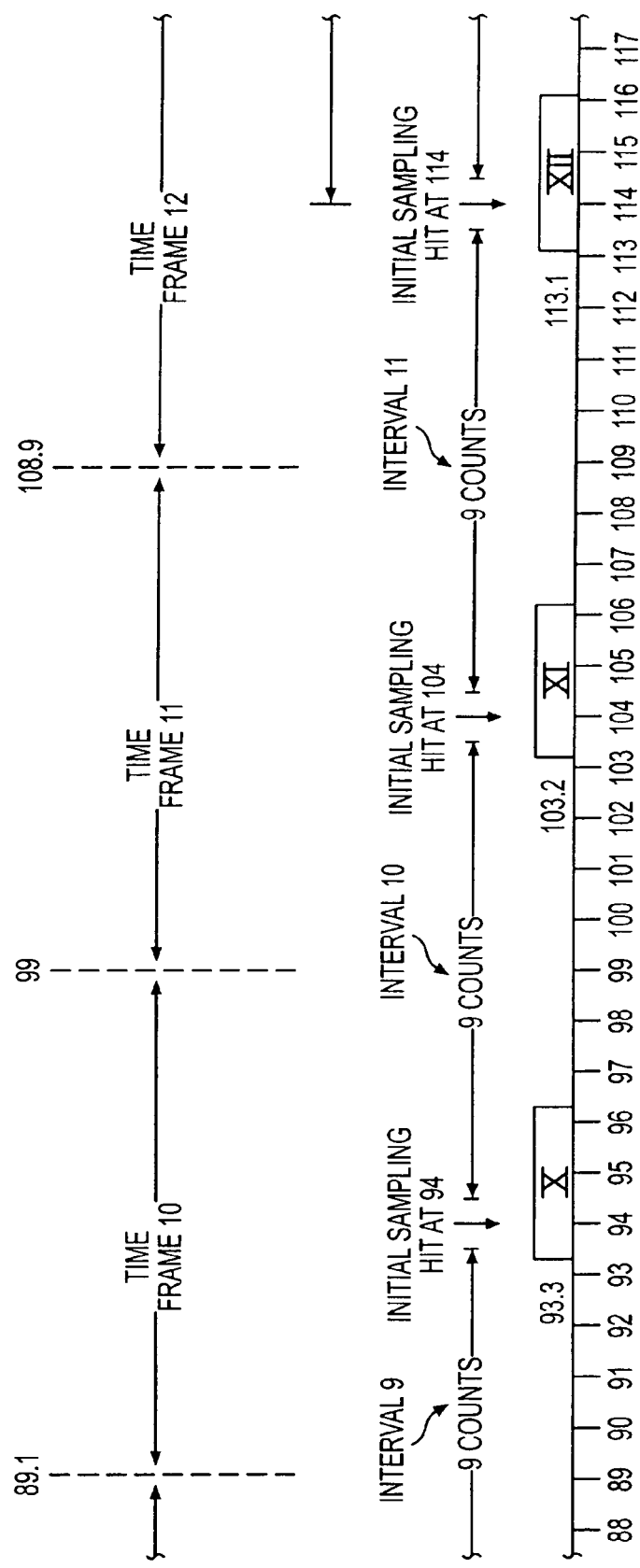
Figure 1E:
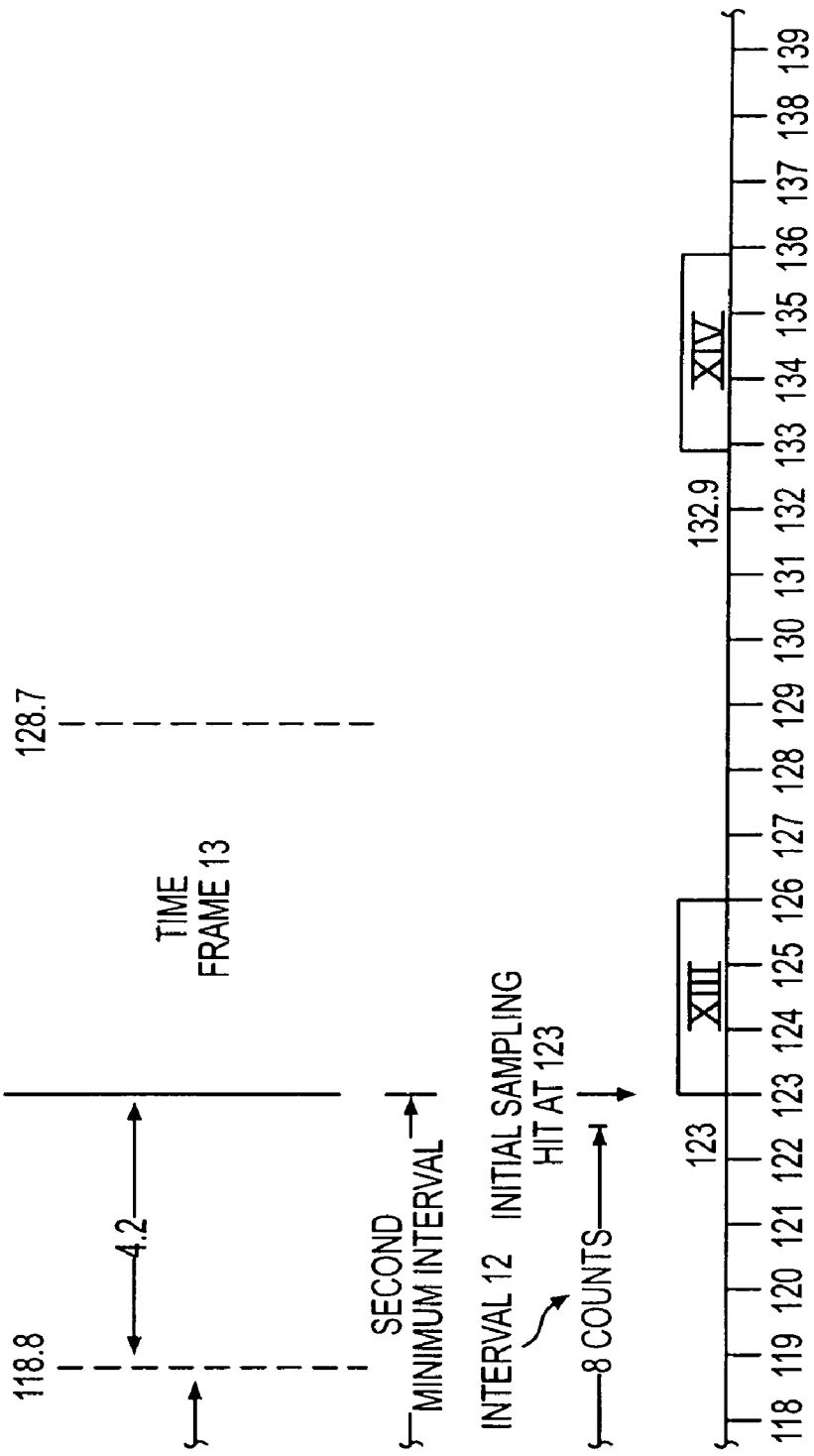
Figure 1F:
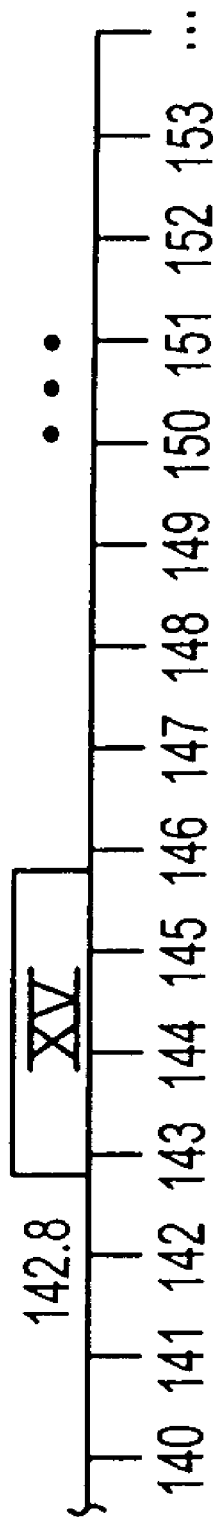

FIG. 1A shows that the sampling times begin at count number 0. A first sampling time, for probing for a presence of an input pulse, begins at count number 0.

Cyclic input pulses I through XV are received over time. The cyclic input pulses are shown on time-line T. The cyclic input pulses can be electrical cyclic input pulses. The cyclic input pulses are located within time frames. Each cyclic input pulse begins after a same time interval after a start signal of its time frame.

The input pulses have the same period as the start signals of the time frames. The count value between start signals, and between leading edges of input pulses, is equal to 9.9 count numbers on time-line T.

FIG. 1A shows an initially detection of a presence of an input pulse, pulse I, is made at count number 5. A presence of input pulse I is also detected at count numbers 6 and 7. After a lapse in time, a presence of pulse II is initially detected at count number 15. Thereafter, presence of input pulses are initially detected at each of count numbers 24, 34, 44, 54, 64, 74, 84, 94, 104, 114, 123, 133 and 143. An initial detection of a presence of an input pulse is referred to as an initial sampling hit.

A detection pause begins at count number 0 and lasts until a presence of an input pulse is detected at count number 5. The detection pause occurs as part of a start-up phase, before a first initial sampling hit is obtained at count number 5.

A sampling interval 1 occurs after initial sampling hit, at count numbers 5, and before initial sampling hit, at count number 15. Interval 1 contains 9 counts. A sampling interval 2 occurs after an initial sampling hit, at count number 15, and before an initial sampling hit, at count number 24.

Interval 2 contains 8 counts. Later sampling intervals 3 through 12, occur between later initial sampling hits. Sampling interval 1, 3, 4, 5, 6, 7, 8, 9, 10 and 11 contain 9 counts. Sampling intervals 2 and 12 contain 8 counts.

Interval 2 and 12 are thus found to be minimum sampling intervals. Interval 2 contains a minimum number of counts, namely 8 counts. The 8 counts occur between an initial sampling hit, at count number 15, and an initial sampling hit, at count number 24. Interval 12 contains a minimum number of counts, namely 8 counts, These latter 8 counts occur between an initial sampling hit, at count number 114, and an initial sampling hit, at count number 123. The shorter intervals 2 and 12 indicate that the cyclic input pulses are out of phase relative to the sampling times.

Each of intervals 2 and 12 is referred to as a minimum sampling interval, or simply a minimum interval. Count number 24, at the back end of the first minimum sampling interval, interval 2, is referred to as S1. Count number 123, at the back end of the second minimum sampling interval, interval 12, is referred to as S2. S1 the count number at the end of a first minimum sampling interval, interval 2. S2 is the count number at the back end of the second minimum sampling interval, interval 12.

Nine sampling intervals occur after minimum sampling interval 2 and before minimum sampling interval 12. These nine sampling intervals are sampling intervals 3, 4, 5, 6, 7, 8, 9, 10 and 11. Each of these nine sampling intervals contains 9 counts.

S2 is the count number at initial sampling hit after the second minimum sampling interval. S1 is the count number at initial sampling hit after first minimum sampling interval. S2, that is, count number 123, is located at, or very near to, a leading edge of input pulse XIII. S1, that is, count number 24, is located at, or very near to, a leading edge of pulse III. The count number of the initial sampling hit after the second minimum sampling interval 12, is 123. S2=123. The count number of the initial sampling hit after the first minimum interval 2, is 24. S1=24.

Again, as seen from FIG. 1, initial sampling hits occur at count numbers 5, 15, 24, 34, 44, 54, 64, 74, 84, 94, 104, 114 and 123. There is a minimum sampling interval 2 between count numbers 15 and 24. There is a minimum sampling interval 12 between count numbers 114 and 123. There are 8 sampling points between initial sampling hits at count numbers 15 and 24, that is, in minimum sampling interval 2. There are 8 sampling points between initial sampling hits at count numbers 114 and 123, that is, in minimum sampling interval 12. Minimum sampling intervals 2 and 12 have fewer count numbers than do sampling intervals 3, 4, 5, 6, 7, 8, 9, 10, and 11. Sampling intervals 2 and 12 are referred to as minimum sampling intervals.

The varying lengths of the sampling intervals 1 through 12 are used to find the leading edge of an input pulse. In this embodiment the leading edge of each of input pulses III and XIII is found by first finding the minimum sampling intervals 2 and 12. The leading edge of an input pulse occurs at the count number that is at the end of a minimum sampling interval. In this embodiment a leading edge of pulse III is located at count number 24. A leading edge of pulse XIII is located at count number 123.

Time frames are located around the input pulses. The time frames hold the input pulses. Each time frame has an equal length. The length of a time frame is equal to the period between input pulses. A received start signal of a first time frame begins the sampling times. Count 0 occurs at the start signal of the first time frame. A first sampling time occurs at count number 0. The count number 1, at the second sampling time, occurs at a fixed time interval after the start signal of the first time frame. The time interval, ST, between sampling times is 0.1 seconds, in the present embodiment.

In FIG. 1, the first time frame is 9.9 count numbers long. Each input pulse is located in a time frame. Each time frame is 9.9 count numbers long, that is, 0.99 seconds long.

Time between the start time of a leading edge of an input pulse and the start time of a start signal of a time frame that holds the input pulse is called DeltaT. DeltaT is determined to be 0.42 seconds, as explained below.

The time frames for the input pulses have a length equal to the period of the input pulses. The time frames have a length of 9.9 count numbers. The leading edges of the input pulses are separated by 9.9 count numbers.

The known count value, CV, of the start signal of time frame 3 is 19.8. This count value is known since the start signal of frame 3 is separately detectable.

Time frame 3 is used to determine a time, DeltaT, between the occurrence of the leading edge of input pulse III with respect to the occurrence of the start signal of time frame 3. Time frame 3 is the time frame that has its start signal during a time span that is related to the first minimum sampling interval. In FIG. 1, the leading edge of pulse III is located within time frame 3, at the sampling time having count number 24. S1=24. Time frame 3 begins at count value 19.8. 19.8=CV. Time frame 3 begins at count number value 19.8. The leading edge of input pulse III occurs at count value difference, CVD, of 4.2 from the start of the time frame 3, which is at count number value 19.8. CVD=(S−CV). DeltaT=(S1−CV)LT. Again, LT is the separation time between two adjacent sampling times. Therefore DeltaT=(24−19.8)LT=4.2×0.1 seconds. DeltaT=0.42 seconds. Thus the leading edge of input pulse III occurs at a time DeltaT that is 0.42 seconds greater than the time of occurrence of the start signal of the time frame 3. Further, each input pulse occurs at a time having a value of 0.42 seconds after the time of occurrence of the start signal of a time frame that holds that input pulse.

While the present invention has been disclosed in conjunction with the preferred embodiment thereof, it should be understood that there may be other embodiments which fall within the spirit and scope of the invention defined by the following claims.

What is claimed is:

1. A method for detecting an occurrence of a leading edge of a cyclic input pulse of a series of cyclic input pulses, comprising:
    (a) taking a sample of cyclic input pulses at each of a series of sampling times, the sampling times being separated from each other by a single fixed time interval, each sampling time of the series of sampling times having a count number, the count numbers being in successive order;
    (b) detecting sampling hits, each sampling hit being an indication of a presence of a cyclic input pulse;
    (c) recording the count number at each of the sampling hits;
    (d) determining initial sampling hits from the detected sampling hits;
    (e) determining a minimum sampling interval between initial sampling hits; and
    (f) determining a count number located at a back end of the minimum sampling interval, the count number located at the back end of the minimum sampling interval being an indication of the occurrence of a lead edge of a cyclic input pulse.

2. A method of determining a separation time between a leading edge of a cyclic input pulse and a start signal of a time frame that contains the cyclic input pulse, the cyclic input pulse being part of a series of cyclic input pulses, comprising:
    (a) taking a sample of the cyclic input pulses at each of a series of sampling times, the sampling times being separated from each other by a single fixed time interval ST, each sampling time of the series of sampling times having a successive count number;
    (b) detecting sampling hits, each sampling hit being at an occurrence of an input pulse at a sampling time;
    (c) recording the count number at each of the sampling hits.
    (d) determining a minimum sampling interval between initial sampling hits;
    (e) determining a count number located at a back end of the minimum sampling interval, the count number located at the back end of the minimum sampling interval being an indication of the occurrence of a lead edge of a cyclic input pulse;
    (f) sensing a start signal of a first time frame around a first cyclic input pulse of the series of cyclic input pulses, a start signal of each time frame having a known count value;
    (g) determining a count value CV that occurs at the start signal of a time frame that contains the count number S; and
    (h) subtracting the count value CV from the count number S, and multiplying the result of the subtraction by ST, to determine the separation time between the leading edge of the cyclic input pulse and a start signal of a time frame that contains the cyclic input pulse.

* * * * *